United States Patent
Choo et al.

(10) Patent No.: US 9,576,669 B2
(45) Date of Patent: Feb. 21, 2017

(54) NONVOLATILE MEMORY DEVICES AND METHODS OF PROGRAMMING AND READING NONVOLATILE MEMORY DEVICES

(71) Applicant: SAMSUNG ELECTRONICS CO., LTD., Suwon-Si, Gyeonggi-Do (KR)

(72) Inventors: Gyo-Soo Choo, Yongin-Si (KR); Chang-Bum Kim, Seoul (KR); Duk-Min Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/995,246

(22) Filed: Jan. 14, 2016

(65) Prior Publication Data

US 2016/0307630 A1    Oct. 20, 2016

(30) Foreign Application Priority Data

Apr. 20, 2015    (KR) .......................... 10-2015-0055426

(51) Int. Cl.
| | |
|---|---|
| *G11C 16/10* | (2006.01) |
| *G11C 16/26* | (2006.01) |
| *G11C 16/34* | (2006.01) |
| *G11C 16/32* | (2006.01) |

(52) U.S. Cl.
CPC ............ *G11C 16/10* (2013.01); *G11C 16/26* (2013.01); *G11C 16/32* (2013.01); *G11C 16/3459* (2013.01)

(58) Field of Classification Search
CPC ......... G11C 16/10; G11C 16/26; G11C 16/32; G11C 16/3459; G11C 16/34
USPC .......................... 365/185.22, 185.18, 185.21
See application file for complete search history.

(56) References Cited

U.S. PATENT DOCUMENTS

| | | | |
|---|---|---|---|
| 7,233,522 B2 | 6/2007 | Chen et al. | |
| 7,295,473 B2 | 11/2007 | Fong et al. | |
| 7,554,862 B2* | 6/2009 | Shibata | G11C 5/147 365/185.24 |
| 8,477,534 B2 | 7/2013 | Iwai et al. | |
| 8,593,877 B2* | 11/2013 | Joo | G11C 16/0483 365/185.17 |
| 2002/0075727 A1 | 6/2002 | Jeong et al. | |
| 2005/0254309 A1 | 11/2005 | Kwon et al. | |
| 2008/0094927 A1 | 4/2008 | Kim | |
| 2008/0158974 A1 | 7/2008 | Mokhlesi | |
| 2010/0046300 A1* | 2/2010 | Sarin | G11C 11/5628 365/185.19 |

FOREIGN PATENT DOCUMENTS

| | | |
|---|---|---|
| KR | 2002-0047770 A | 6/2002 |
| KR | 2008-0035352 A | 4/2008 |
| KR | 2009-0117709 A | 11/2009 |

* cited by examiner

*Primary Examiner* — Tan T. Nguyen
(74) *Attorney, Agent, or Firm* — Volentine & Whitt, PLLC

(57) ABSTRACT

In a method of programming a nonvolatile memory device, a program operation is performed on a selected memory cell coupled to a selected word line in response to a program command, a negative bias voltage is applied to the selected word line, a verification pass voltage is applied to an unselected word line after the negative bias voltage is applied to the selected word line, and a first program verification voltage, which is higher than the negative bias voltage and lower than a ground voltage, is applied to the selected word line.

16 Claims, 16 Drawing Sheets

NONVOLATILE MEMORY DEVICES AND METHODS OF PROGRAMMING AND READING NONVOLATILE MEMORY DEVICES

CROSS-REFERENCE TO RELATED APPLICATION(S)

A claim of priority under 35 USC §119 is made to Korean Patent Application No. 10-2015-0055426, filed on Apr. 20, 2015 in the Korean Intellectual Property Office (KIPO), the entire contents of which are hereby incorporated by reference.

BACKGROUND

The inventive concepts described herein relate to nonvolatile memory devices, and more particularly to methods of programming and reading nonvolatile memory devices.

Semiconductor memory devices may be classified into volatile semiconductor memory devices and nonvolatile semiconductor memory devices. While volatile semiconductor memory devices may perform read and write operations at high speed, contents stored therein may be lost when the devices are powered-off. Nonvolatile semiconductor memory devices may retain contents stored therein even when powered-off. For this reason, nonvolatile semiconductor memory devices are typically used to store contents that are to be retained regardless of whether the devices are powered on or off.

Examples of nonvolatile semiconductor memory devices include mask read-only memories (MROMs), programmable ROMs (PROMs), erasable programmable ROMs (EPROMs), electrically erasable programmable ROMs (EEPROMs), or the like.

A flash memory device is a typical nonvolatile memory device. Flash memory devices are widely used as voice and image storing mediums of electronic apparatuses such as computers, cellular phones, personal digital assistants (PDAs), digital cameras, camcorders, voice recorders, MP3 players, handheld PCs, game machines, facsimiles, scanners, printers, or the like.

As highly integrated memory devices have recently become increasingly necessary, multi-bit memory devices capable of storing multi-bit data in memory cells have become more common. As the operation speed of electronic devices increase, the operation speed of memory devices must also increase. However, programming speed and reading speed of flash memories are generally low.

SUMMARY

Embodiments of the inventive concept are directed to providing a method of programming a nonvolatile memory device that increases an operation speed of the nonvolatile memory device. Other embodiments of the inventive concept are directed to providing a method of reading a nonvolatile memory device that increases an operation speed of the nonvolatile memory device. Embodiments of the inventive concept are directed to providing a nonvolatile memory device that performs the method of programming and reading a nonvolatile memory device.

Embodiments of the inventive concept provide a method of programming a nonvolatile memory device, wherein a program operation is performed on a selected memory cell coupled to a selected word line in response to a program command, a negative bias voltage is applied to the selected word line, a verification pass voltage is applied to an unselected word line after the negative bias voltage is applied to the selected word line, and a first program verification voltage, which is higher than the negative bias verification voltage and lower than a ground voltage, is applied to the selected word line.

In some embodiments of the inventive concept, the first program verification voltage is applied to the selected word line at a same time as the verification pass voltage is applied to the unselected word line.

In some embodiments of the inventive concept, the first program verification voltage is applied to the selected word line after a delay time from a time at which the verification pass voltage is applied to the unselected word line.

The delay time may be adjusted based on a coupling capacitance between the selected word line and the unselected word line.

In some embodiments of the inventive concept, a magnitude of the negative bias voltage is determined based on a coupling capacitance between the selected word line and the unselected word line.

In some embodiments of the inventive concept, the method further includes applying a second program verification voltage, which has a positive voltage level, to the selected word line after the first program verification voltage is applied to the selected word line.

In some embodiments of the inventive concept, the negative bias voltage and the first program verification voltage are generated by a selected word line voltage generator, and the verification pass voltage is generated by an unselected word line voltage generator.

In some embodiments of the inventive concept, the nonvolatile memory device includes a three dimensional memory cell array.

Embodiments of the inventive concept provide a method of reading a nonvolatile memory device, wherein a negative bias voltage is applied to a selected word line in response to a read command, a read pass voltage is applied to an unselected word line after the negative bias voltage is applied to the selected word line, and a first read voltage, which is higher than the negative bias voltage and lower than a ground voltage, is applied to the selected word line.

In some embodiments of the inventive concept, the first read voltage is applied to the selected word line at a same time as the read pass voltage is applied to the unselected word line.

In some embodiments of the inventive concept, the first read voltage is applied to the selected word line after a delay time from a time at which the read pass voltage is applied to the unselected word line.

The delay time may be adjusted based on a coupling capacitance between the selected word line and the unselected word line.

In some embodiments of the inventive concept, a magnitude of the negative bias voltage is determined based on a coupling capacitance between the selected word line and the unselected word line.

In some embodiments of the inventive concept, the method further includes applying a second read voltage, which has a positive voltage level, to the selected word line after the first read voltage is applied to the selected word line.

In some embodiments of the inventive concept, the negative bias voltage and the first read voltage are generated by a selected word line voltage generator, and the read pass voltage is generated by an unselected word line voltage generator.

Embodiments of the inventive concept provide a method of performing a memory access operation to a nonvolatile memory device, the method including applying a negative bias voltage to a selected word line in response to a command, applying an operation pass voltage to an unselected word line after the negative bias voltage is applied to the selected word line, and applying a first operation voltage, which is higher than the negative bias voltage and lower than a ground voltage, to the selected word line.

BRIEF DESCRIPTION OF THE DRAWINGS

Embodiments of the inventive concept will be more clearly understood from the following detailed description taken in conjunction with the accompanying figures, and wherein like reference numerals refer to like parts throughout the various figures unless otherwise specified.

DETAILED DESCRIPTION OF THE EMBODIMENTS

Figure 1:
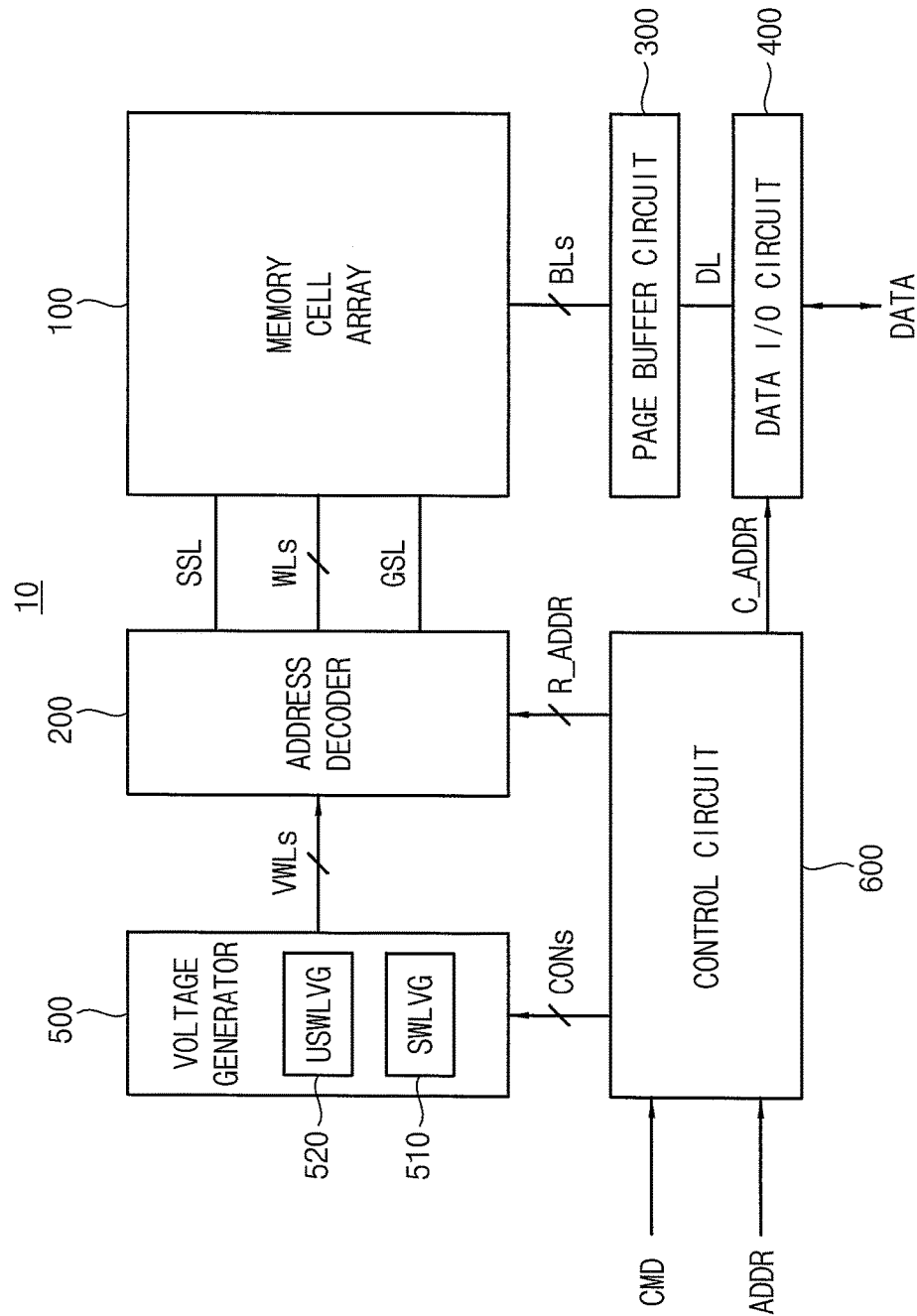
FIG. 1 illustrates a block diagram of a nonvolatile memory device, according to an embodiment of the inventive concept.

Various example embodiments will be described more fully with reference to the accompanying drawings. The inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It should be understood that, although the terms first, second, etc. may be used herein to describe various elements, these elements should not be limited by these terms. These terms are used to distinguish one element from another. For example, a first element may be termed a second element, and, similarly, a second element may be termed a first element, without departing from the scope of the present inventive concept. As used herein, the term "and/or" includes any and all combinations of one or more of the associated listed items.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," or the like).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It should be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It should be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a nonvolatile memory device, according to an embodiment of the inventive concept.

Referring to FIG. 1, the nonvolatile memory device 10 includes a memory cell array 100, an address decoder 200, a page buffer circuit 300, a data input/output circuit 400, a voltage generator 500, and control circuit 600.

The memory cell array 100 may be coupled to the address decoder 200 through a string selection line SSL, a plurality of word lines WLs, and a ground selection line GSL. In addition, the memory cell array 100 is coupled to the page buffer circuit 300 through a plurality of bit lines BLs. The memory cell array 100 includes a plurality of memory cells coupled to the plurality of word lines WLs and the plurality of bit lines BLs.

In some embodiments of the inventive concept, the memory cell array 100 may be a three-dimensional memory cell array formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other embodiments of the inventive concept, the memory cell array 100 may be a two-dimensional memory cell array formed on a substrate in a two-dimensional structure (or a horizontal structure).

Figure 2:
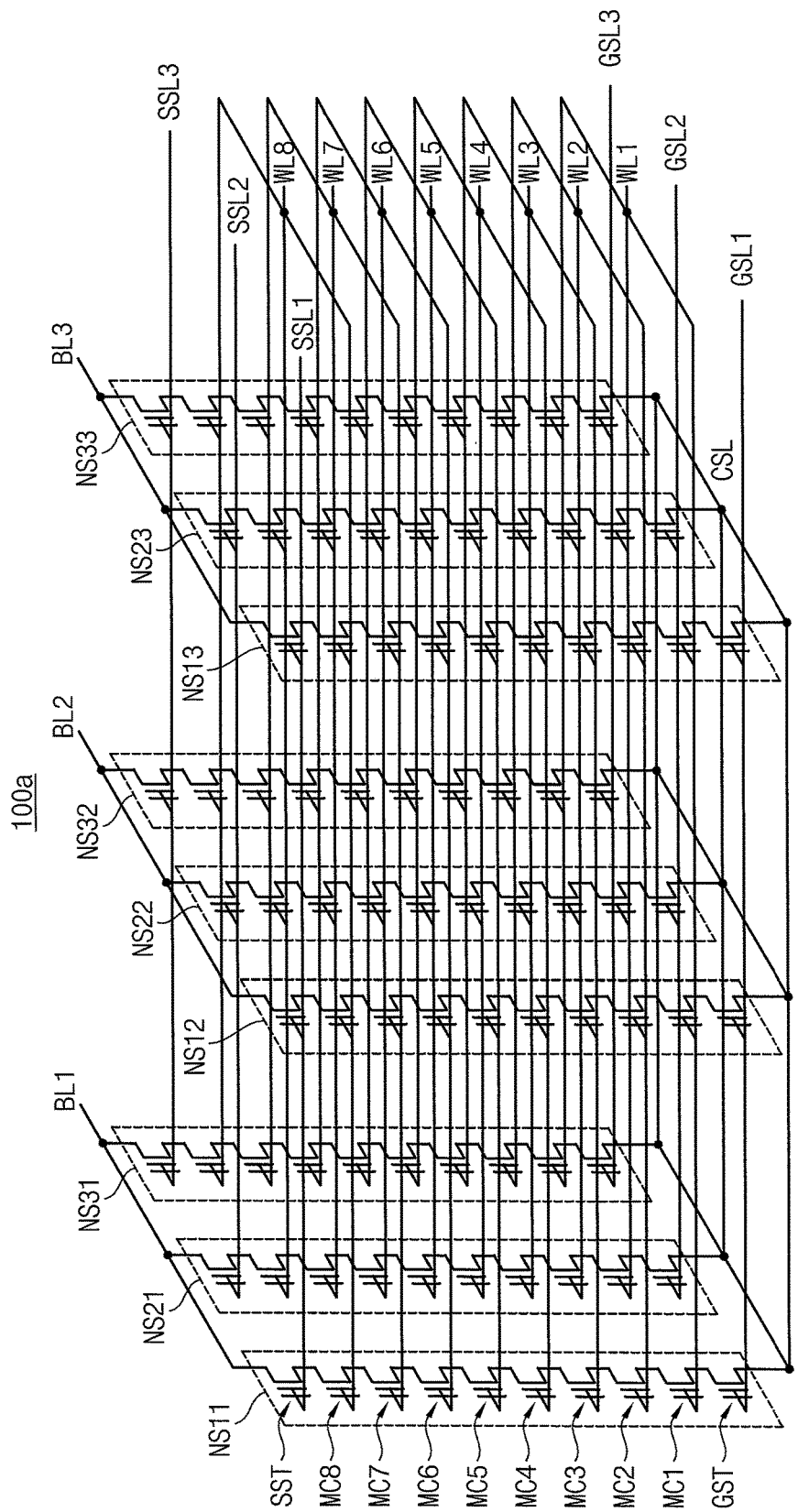
FIG. 2 illustrates a circuit diagram of memory cell array of the nonvolatile memory device of FIG. 1, according to an embodiment of the inventive concept.

FIG. 2 illustrates a circuit diagram of a memory cell array of the nonvolatile memory device of FIG. 1, according to an embodiment of the inventive concept.

A memory cell array 100a of FIG. 2 is formed on a substrate in a three-dimensional structure (or a vertical structure). For example, a plurality of memory cell strings included in the memory cell array 100a is formed in a direction perpendicular to the substrate.

Referring to FIG. 2, the memory cell array 100a includes memory cell strings NS11 to NS33 coupled between bit lines BL1, BL2 and BL3 and a common source line CSL. Each of the memory cell strings NS11 to NS33 may include a string selection transistor SST, a plurality of memory cells MC1 to MC8, and a ground selection transistor GST.

In FIG. 2, each of the memory cell strings NS11 to NS33 are shown as including eight memory cells MC1 to MC8. However, embodiments of the inventive concept are not limited thereto. In some embodiments of the inventive concept, each of the memory cell strings NS11 to NS33 may include any number of memory cells.

The string selection transistors SSTs are connected to corresponding string selection lines SSL1 to SSL3. The plurality of memory cells MC1 to MC8 are connected to corresponding word lines WL1 to WL8, respectively. The ground selection transistors GSTs are connected to corresponding ground selection lines GSL1 to GSL3. The string selection transistors SSTs are connected to corresponding bit lines BL1, BL2 and BL3, and the ground selection transistors GSTs are connected to the common source line CSL.

Word lines (e.g., WL1) having the same height are commonly connected to each other, and the ground selection lines GSL1 to GSL3 are separated from each other and the string selection lines SSL1 to SSL3 are separated from each other.

In FIG. 2, the memory cell array 100a is shown as coupled to eight word lines WL1 to WL8 and three bit lines BL1 to BL3. However, embodiments of the inventive concept are not limited thereto. In some embodiments of the inventive concept, the memory cell array 100a may be coupled to any number of world lines and bit lines.

Figure 3:
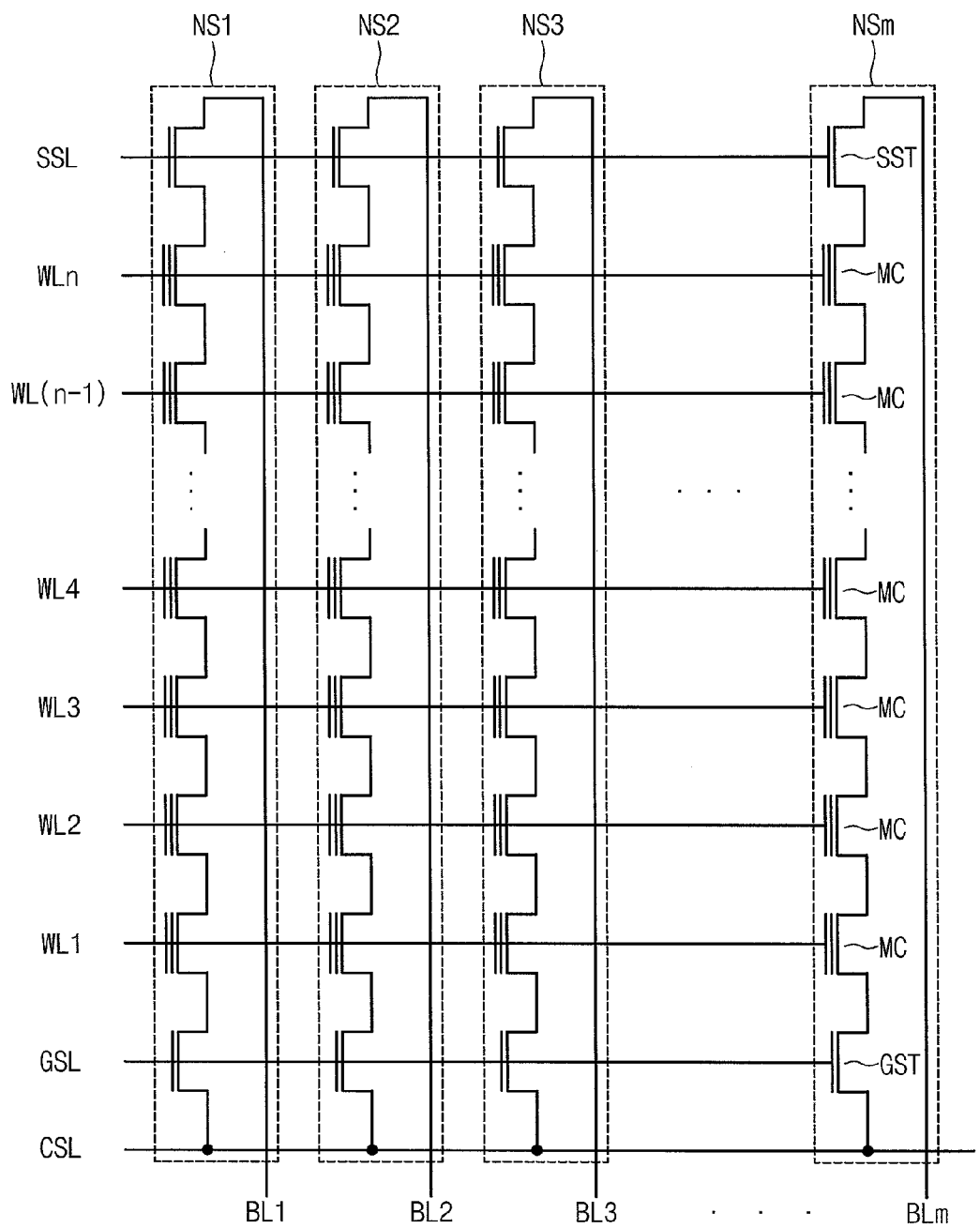
FIG. 3 illustrates a circuit diagram of memory cell array of the nonvolatile memory device of FIG. 1, according to another embodiment of the inventive concept.

FIG. 3 illustrates a circuit diagram of a memory cell array of the nonvolatile memory device of FIG. 1, according to another embodiment of the inventive concept.

A memory cell array 100b of FIG. 3 is formed on a substrate in a two-dimensional structure (or a horizontal structure). For example, a plurality of memory cell strings included in the memory cell array 100b is formed in a direction parallel to the substrate.

Referring to FIG. 3, the memory cell array 100b includes memory cell strings NS1 to NSm. Each of the memory cell strings NS1 to NSm may include a string selection transistor SST, a plurality of memory cells MC, and a ground selection transistor GST that are serially connected to each other.

The string selection transistors SSTs included in each of the memory cell strings NS1 to NSm are commonly connected to the string selection line SSL. Memory cells arranged in a same row among memory cells MC included in each of the memory cell strings NS1 to NSm are commonly connected to corresponding word lines WL1 to WLn. The ground selection transistors GSTs included in each of the memory cell strings NS1 to NSm are commonly connected to the ground selection line GSL.

The ground selection transistors GSTs included in each of the memory cell strings NS1 to NSm are commonly connected to the common source line CSL. The string selection transistors SSTs included in each of the memory cell strings NS1 to NSm are connected to corresponding bit lines BL1 to BLm. Here, n and m represent positive integers.

Referring again to FIG. 1, the control circuit 600 receives a command signal CMD and an address signal ADDR from an external device (e.g., a memory controller), and controls a program operation, a read operation, and an erase operation of the nonvolatile memory device 10 based on the command signal CMD and the address signal ADDR.

For example, the control circuit 600 generates control signals CONs, which are used for controlling the voltage generator 500, based on the command signal CMD, and generates a row address R_ADDR and a column address C_ADDR based on the address signal ADDR. The control circuit 600 provides the row address R_ADDR to the address decoder 200 and provides the column address C_ADDR to the data input/output circuit 400.

The address decoder 200 may be coupled to the memory cell array 100 through the string selection line SSL, the plurality of word lines WLs, and the ground selection line GSL. During the program operation or the read operation, the address decoder 200 determines one of the plurality of word lines WLs as a selected word line SEL_WL, and determines the rest of the plurality of word lines WLs except for the selected word line SEL_WL as unselected word lines UNSEL_WL based on the row address R_ADDR.

The voltage generator 500 generates word line voltages VWLs, which are required for the operation of the nonvolatile memory device 10, based on the control signals CONs. The word line voltages VWLs are applied to the plurality of word lines WLs through the address decoder 200.

The voltage generator 500 includes a selected word line voltage generator SWLVG 510 and an unselected word line voltage generator USWLVG 520.

During the program operation or the read operation, the address decoder 200 couples the selected word line SEL_WL to the selected word line voltage generator 510, and couples the unselected word lines UNSEL_WL to the unselected word line voltage generator 520.

During the program operation or the read operation, the selected word line voltage generator 510 generates a voltage that is to be applied to the selected word line SEL_WL, and the unselected word line voltage generator 520 generates a voltage that is to be applied to the unselected word lines UNSEL_WL.

For example, during the program operation, the selected word line voltage generator 510 generates a program voltage VPGM and a program verification voltage VPV, and the unselected word line voltage generator 520 generates a program pass voltage VPPASS and a verification pass voltage VVPASS. In some embodiments of the inventive concept, the selected word line voltage generator 510 may increase a magnitude of the program voltage VPGM as a program loop proceeds.

In addition, during the read operation, the selected word line voltage generator 510 generates a read voltage VRD, and the unselected word line voltage generator 520 generates a read pass voltage VRPASS.

Figure 4:
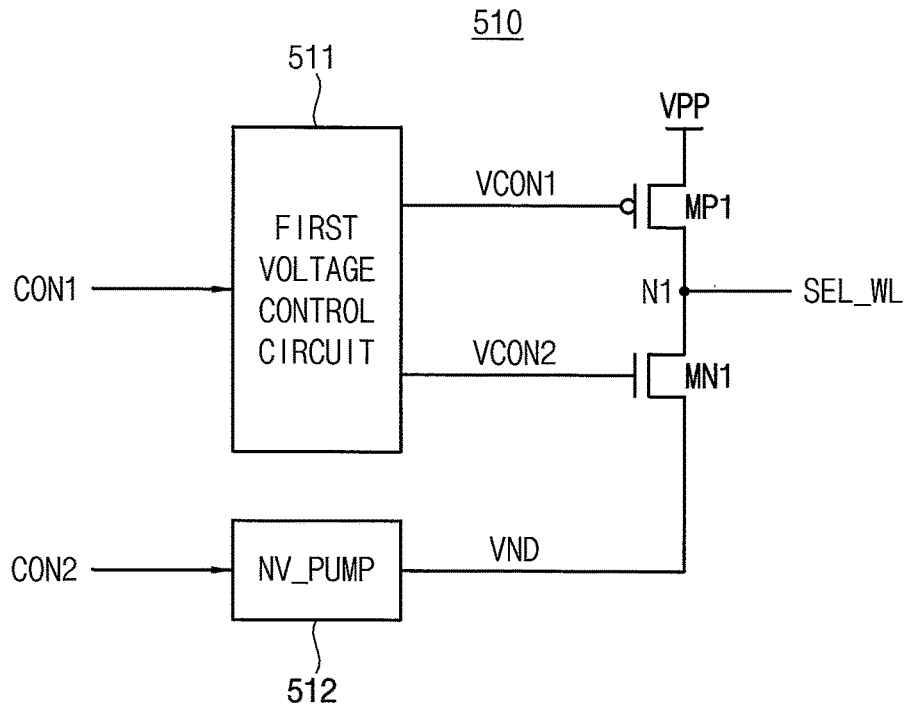
FIG. 4 illustrates a block diagram of a selected word line voltage generator of the nonvolatile memory device of FIG. 1, according to an embodiment of the inventive concept.

FIG. 4 illustrates a block diagram of a selected word line voltage generator of the nonvolatile memory device of FIG. 1, according to an embodiment of the inventive concept.

Referring to FIG. 4, the selected word line voltage generator 510 includes a first voltage control circuit 511, a negative voltage pump NV_PUMP 512, a first p-type metal oxide semiconductor (PMOS) transistor MP1, and a first n-type metal oxide semiconductor (NMOS) transistor MN1.

The first voltage control circuit 511 adjusts a magnitude of a first voltage control signal VCON1 and a magnitude of a second voltage control signal VCON2 based on a first control signal CON1 provided from the control circuit 600.

The negative voltage pump 512 adjusts a magnitude of a negative drive voltage VND based on a second control signal CON2 provided from the control circuit 600.

The first PMOS transistor MP1 includes a source coupled to a positive drive voltage VPP, a drain coupled to a first node N1, and a gate receiving the first voltage control signal VCON1.

The first NMOS transistor MN1 includes a source coupled to the negative drive voltage VND, a drain coupled to the first node N1, and a gate receiving the second voltage control signal VCON2.

The first node N1 is coupled to the selected word line SEL_WL through the address decoder 200.

As illustrated in FIG. 4, the selected word line voltage generator 510 applies a positive voltage or a negative voltage, which has a magnitude that is determined based on the first control signal CON1 and the second control signal CON2, to the selected word line SEL_WL.

Figure 5:
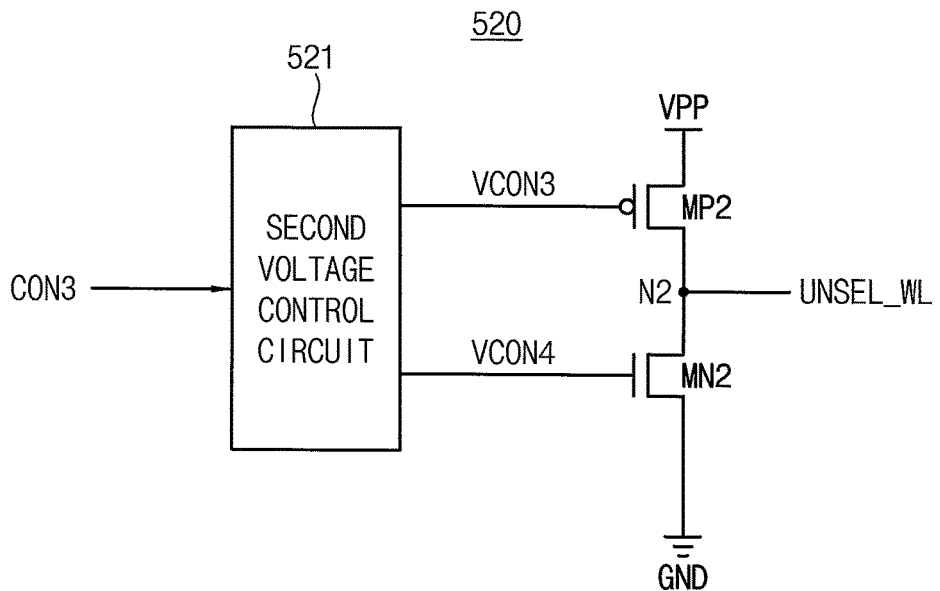
FIG. 5 illustrates a block diagram of an unselected word line voltage generator of the nonvolatile memory device of FIG. 1, according to an embodiment of the inventive concept.

FIG. 5 illustrates a block diagram of an unselected word line voltage generator of the nonvolatile memory device of FIG. 1, according to an embodiment of the inventive concept.

Referring to FIG. 5, the unselected word line voltage generator 520 includes a second voltage control circuit 521, a second PMOS transistor MP2, and a second NMOS transistor MN2.

The second voltage control circuit 521 adjusts a magnitude of a third voltage control signal VCON3 and a magnitude of a fourth voltage control signal VCON4 based on a third control signal CON3 provided from the control circuit 600.

The second PMOS transistor MP2 includes a source coupled to the positive drive voltage VPP, a drain coupled to a second node N2, and a gate receiving the third voltage control signal VCON3.

The second NMOS transistor MN2 includes a source coupled to a ground voltage GND, a drain coupled to the second node N2, and a gate receiving the fourth voltage control signal VCON4.

The second node N2 is coupled to the unselected word lines UNSEL_WL through the address decoder 200.

As illustrated in FIG. 5, the unselected word line voltage generator 520 applies a positive voltage, which has a magnitude that is determined based on the third control signal CON3, to the unselected word lines UNSEL_WL.

Referring again to FIG. 1, the page buffer circuit 300 is coupled to the memory cell array 100 through the plurality of bit lines BLs. The page buffer circuit 300 includes a plurality of page buffers. In some embodiments of the inventive concept, one page buffer may be connected to one bit line. In other embodiments of the inventive concept, one page buffer may be connected to two or more bit lines. The page buffer circuit 300 may temporarily store data to be programmed in a selected page of the memory cell array 100 or data read out from the selected page of the memory cell array 100.

The data input/output circuit 400 is coupled to the page buffer circuit 300 through data lines DL.

During the program operation, the data input/output circuit 400 receives program data DATA from an external device (e.g., a memory controller) and provides the program data DATA to the page buffer circuit 300 based on the column address C_ADDR received from the control circuit 600.

During the read operation, the data input/output circuit 400 provides read data DATA, which are stored in the page buffer circuit 300, to the external device based on the column address C_ADDR received from the control circuit 600.

Figure 6:
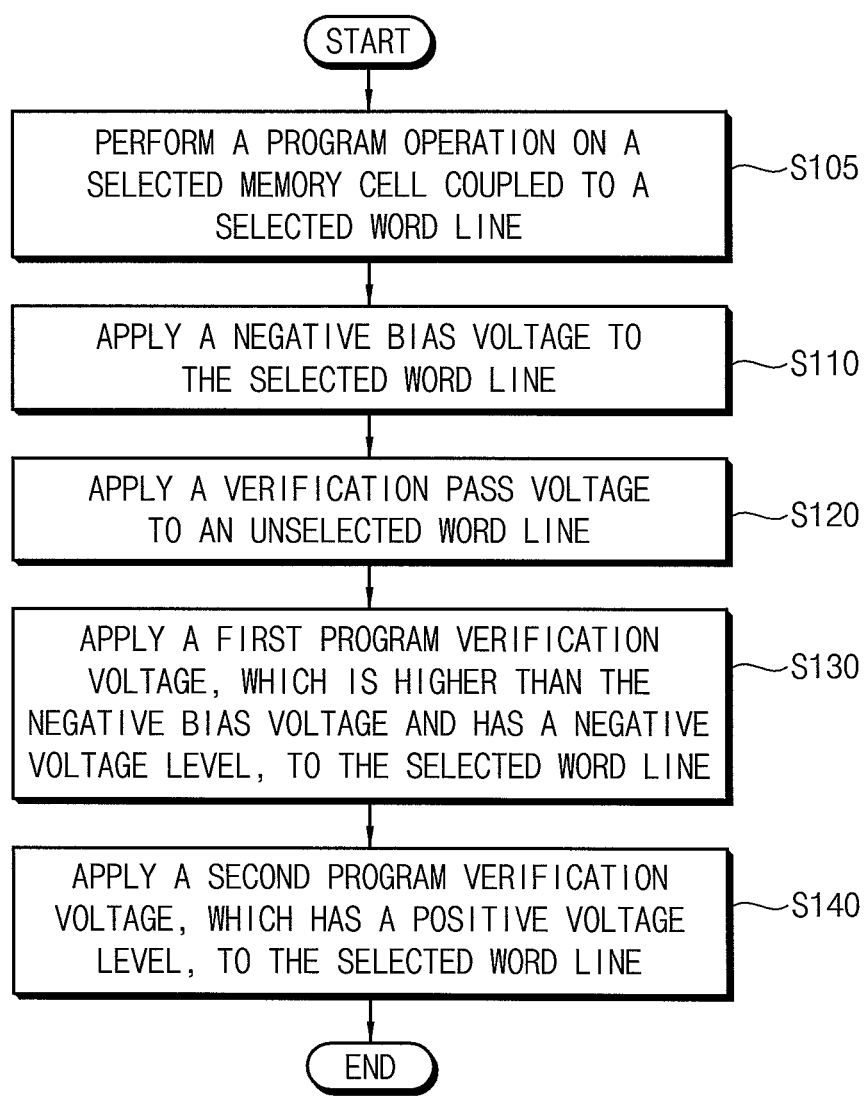
FIG. 6 illustrates a flow chart of a method of programming a nonvolatile memory device, according to an embodiment of the inventive concept.

FIG. 6 illustrates a flow chart of a method of programming a nonvolatile memory device, according to an embodiment of the inventive concept. The method of programming a nonvolatile memory device of FIG. 6 may be performed by the nonvolatile memory device 10 of FIG. 1.

The nonvolatile memory device 10 may program selected memory cells of memory cell array 100 by performing a program loop, including a program stage in which a high voltage is applied to the selected memory cells to increase a threshold voltage of the selected memory cells, and a program verification stage in which the threshold voltage of the selected memory cells is verified. The program loop may be performed a plurality of times.

Figure 7:
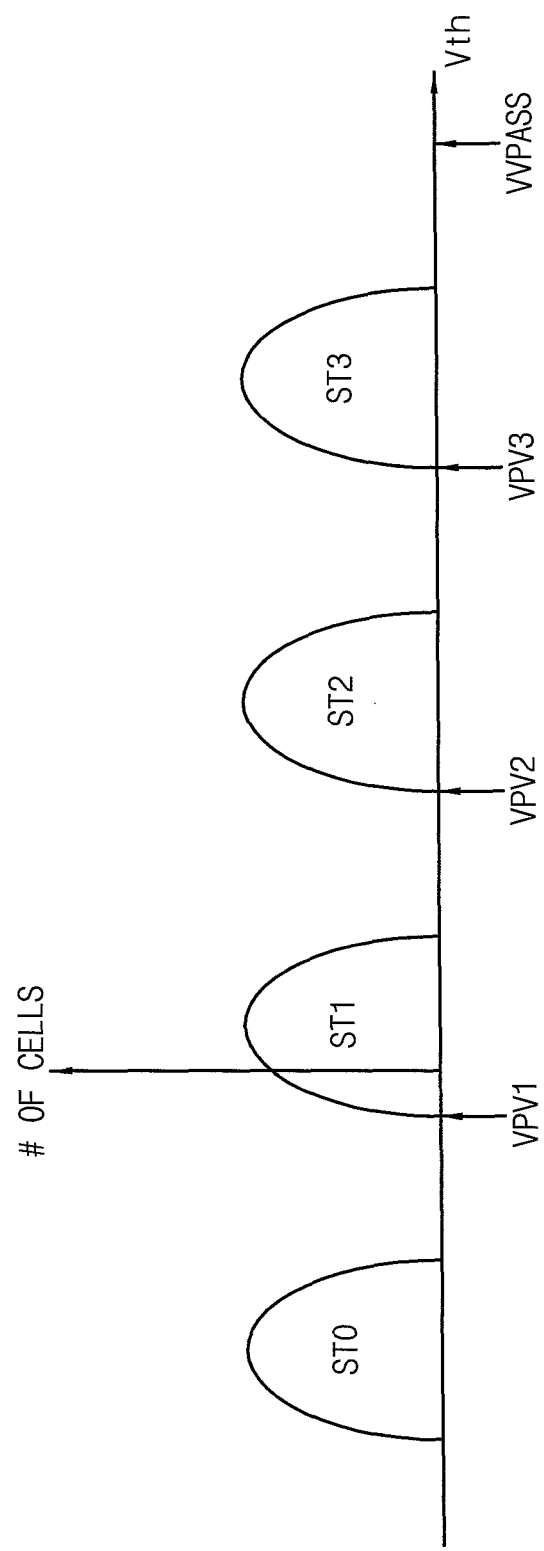
FIG. 7 illustrates a diagram of a threshold voltage distribution of memory cells of the nonvolatile memory device of FIG. 1, according to an embodiment of the inventive concept.

FIG. 7 illustrates a diagram of a threshold voltage distribution of memory cells of the nonvolatile memory device of FIG. 1, according to an embodiment of the inventive concept.

In FIG. 7, the x-axis represents a threshold voltage Vth of the memory cells, and the y-axis represents a number of memory cells. FIG. 7 shows that each of the memory cells has one of an erase state ST0, a first program state ST1, a second program state ST2, and a third program state ST3. However, embodiments of the inventive concept are not limited thereto, and a number of the program states may be varied.

Since the nonvolatile memory device 10 does not perform a rewrite operation, the nonvolatile memory device 10 performs the erase operation on memory cells to change a state of the memory cell to the erase state ST0 before performing the program operation on the memory cells. After the memory cells are changed to the erase state ST0, the program loop may be performed on the memory cells a plurality of times to program each of the memory cells to one of the erase state ST0, the first program state ST1, the second program state ST2, and the third program state ST3.

A threshold voltage of memory cells in the first program state ST1 is higher than a first program verification voltage VPV1, a threshold voltage of memory cells in the second program state ST2 is higher than a second program verification voltage VPV2, and a threshold voltage of memory cells in the third program state ST3 is higher than a third program verification voltage VPV3.

In some embodiments of the inventive concept, as illustrated in FIG. 7, the first program verification voltage VPV1 is a negative voltage which is lower than the ground voltage GND, and the second program verification voltage VPV2 and the third program verification voltage VPV3 are respective positive voltages which are higher than the ground voltage GND.

During a program verification operation, the verification pass voltage VVPASS, which has a sufficiently high voltage level, may be applied to the unselected word lines UNSEL_WL such that memory cells coupled to the unselected word lines UNSEL_WL are turned on regardless of the program states ST0~ST3.

Figure 8:
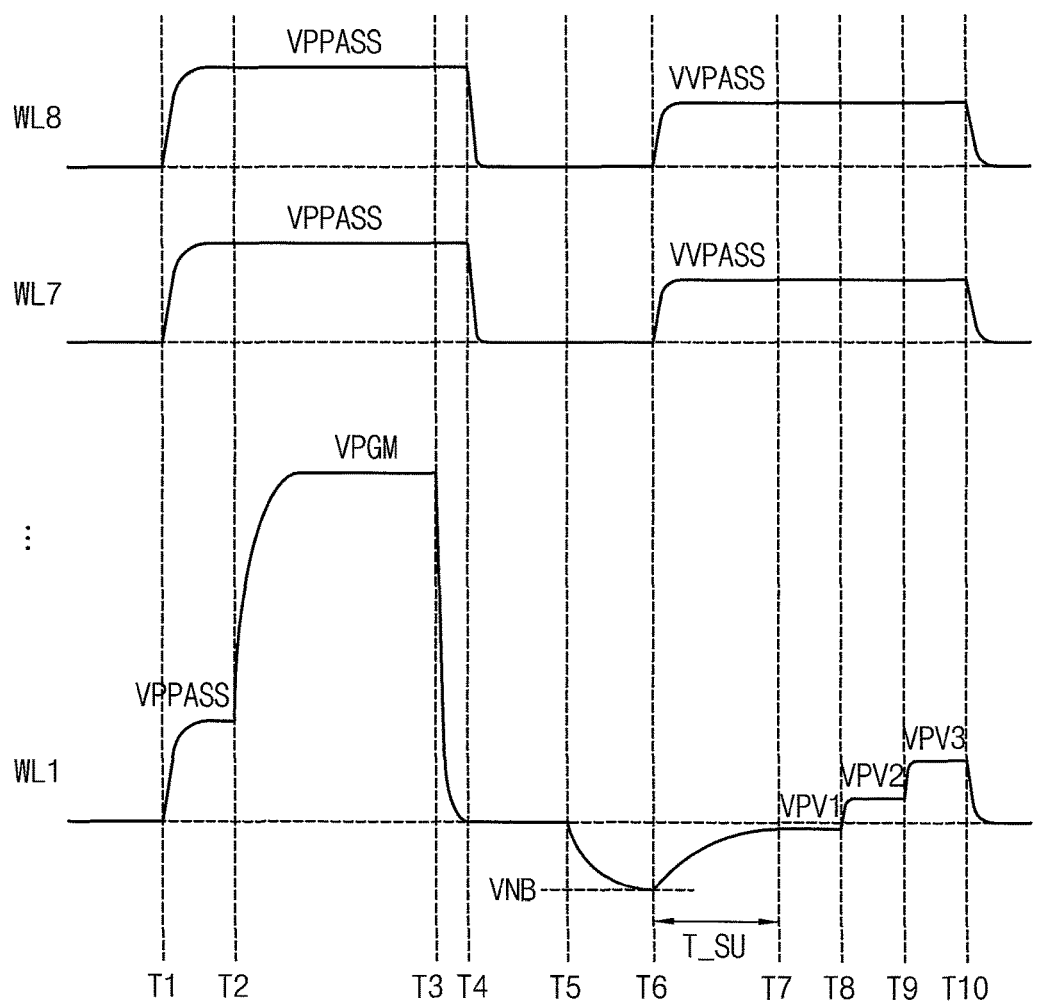
FIG. 8 illustrates a diagram descriptive of the method of programming a nonvolatile memory device of FIG. 6, according to embodiment of the inventive concept.

FIG. 8 illustrates a diagram descriptive of the method of programming a nonvolatile memory device of FIG. 6, according to an embodiment of the inventive concept.

In FIG. 8, for purposes of explanation and not to be construed as limiting, the first word line WL1 corresponds to the selected word line SEL_WL, and the second through eighth word lines WL2~WL8 correspond to the unselected word lines UNSEL_WL. One program loop, which includes the program stage and the program verification stage, is illustrated in FIG. 8.

Hereinafter, the method of programming a nonvolatile memory device of FIG. 6 will be described with reference to FIGS. 1 to 8.

When the nonvolatile memory device 10 receives a program command from an external device (e.g., a memory controller), the nonvolatile memory device 10 may perform a program operation on a selected memory cell coupled to the selected word line WL1 (step S105).

For example, in the program stage of the program loop of FIG. 8, at a first time T1, the selected word line voltage generator 510 applies the program pass voltage VPPASS to the selected word line WL1, and the unselected word line voltage generator 520 applies the program pass voltage VPPASS to the unselected word lines WL2~WL8.

At a second time T2, the selected word line voltage generator 510 performs the program operation on the selected memory cell coupled to the selected word line WL1 by applying the program voltage VPGM, which is higher than the program pass voltage VPPASS, to the selected word line WL1.

At a third time T3, the selected word line WL1 is discharged to the ground voltage GND. At a fourth time T4, the unselected word lines WL2~WL8 are discharged to the ground voltage GND.

In the program verification stage of the program loop, at a fifth time T5, the selected word line voltage generator 510 applies a negative bias voltage VNB to the selected word line WL1 (step S110).

For example, the selected word line voltage generator 510 applies the negative bias voltage VNB to the selected word line WL1 using the negative voltage pump 512. Therefore, a voltage of the selected word line WL1 decreases to the negative bias voltage VNB.

At a sixth time T6, the unselected word line voltage generator 520 applies the verification pass voltage VVPASS to the unselected word lines WL2~WL8 (step S120), and the selected word line voltage generator 510 applies the first program verification voltage VPV1, which is higher than the negative bias voltage VNB and has a negative voltage level, to the selected word line WL1 (step S130) at the same time.

A coupling capacitance may exist among the plurality of word lines WLs of the nonvolatile memory device 10. Therefore, when the verification pass voltage VVPASS having a high voltage level is applied to the unselected word lines WL2~WL8 at the sixth time T6, the voltage of the selected word line WL1 may rapidly increase from the negative bias voltage VNB to the first program verification voltage VPV1 through a coupling effect. Therefore, a setup time T_SU corresponding to a time duration between the sixth time T6, at which the verification pass voltage VVPASS is applied to the unselected word lines WL2~WL8, and a seventh time T7, at which the voltage of the selected word line WL1 is stabilized to the first program verification voltage VPV1, may be reduced.

In some embodiments of the inventive concept, a magnitude of the negative bias voltage VNB may be determined based on the coupling capacitance between the selected word line SEL_WL and the unselected word lines UNSEL_WL. For example, when the coupling capacitance between the selected word line SEL_WL and the unselected word lines UNSEL_WL is relatively large, the negative voltage pump 512 included in the selected word line voltage generator 510 may increase the magnitude of the negative drive voltage VND such that the magnitude of the negative bias voltage VNB, which is applied to the selected word line SEL_WL, may increase. On the other hand, when the coupling capacitance between the selected word line SEL_WL and the unselected word lines UNSEL_WL is relatively small, the negative voltage pump 512 included in the selected word line voltage generator 510 may decrease the magnitude of the negative drive voltage VND such that the magnitude of the negative bias voltage VNB, which is applied to the selected word line SEL_WL, may decrease.

After the voltage of the selected word line WL1 is stabilized to the first program verification voltage VPV1 at the seventh time T7, the nonvolatile memory device 10 performs the program verification operation on the selected memory cell based on the first program verification voltage VPV1.

At an eighth time T8, the selected word line voltage generator 510 applies the second program verification voltage VPV2, which has a positive voltage level, to the selected word line WL1 (step S140), and the nonvolatile memory device 10 performs the program verification operation on the selected memory cell based on the second program verification voltage VPV2.

At a ninth time T9, the selected word line voltage generator 510 applies the third program verification voltage VPV3, which is higher than the second program verification voltage VPV2, to the selected word line WL1, and the nonvolatile memory device 10 performs the program verification operation on the selected memory cell based on the third program verification voltage VPV3.

At a tenth time T10, the selected word line WL1 and the unselected word lines WL2~WL8 may be discharged to the ground voltage GND.

In the program verification stage, if the verification pass voltage VVPASS is applied to the unselected word lines UNSEL_WL and the first program verification voltage VPV1 is applied to the selected word line SEL_WL while the voltage of the selected word line SEL_WL is the ground voltage GND, the voltage of the selected word line SEL_WL may increase to a positive voltage through a coupling effect between the selected word line SEL_WL and the unselected word lines UNSEL_WL and then stabilize to the first program verification voltage VPV1. Therefore, it may take a long time for the voltage of the selected word line SEL_WL to be stabilized to the first program verification voltage VPV1.

However, as described above with reference to FIGS. 1 to 8, in the method of programming a nonvolatile memory device according to embodiments of the inventive concept, after the negative bias voltage VNB is applied to the selected word line SEL_WL, the verification pass voltage VVPASS is applied to the unselected word lines UNSEL_WL and the first program verification voltage VPV1 is applied to the selected word line SEL_WL to perform the program verification operation. Therefore, when the verification pass voltage VVPASS is applied to the unselected word lines UNSEL_WL, the voltage of the selected word line SEL_WL may rapidly increase from the negative bias voltage VNB to the first program verification voltage VPV1 through the coupling effect, according to embodiments of the inventive concept. Therefore, the setup time T_SU corresponding to a time duration between a time, at which the verification pass voltage VVPASS is applied to the unselected word lines UNSEL_WL, and a time, at which the voltage of the selected word line SEL_WL is stabilized to the first program verification voltage VPV1, may be reduced. As such, a program speed of the nonvolatile memory device 10 may effectively increase.

In addition, in the program verification stage, if the verification pass voltage VVPASS is applied to the unselected word lines UNSEL_WL and the first program verification voltage VPV1 is applied to the selected word line SEL_WL at the same time while the voltage of the selected word line SEL_WL is the ground voltage GND, the voltage of the selected word line SEL_WL may increase to a positive voltage through a coupling effect between the selected word line SEL_WL and the unselected word lines UNSEL_WL and then stabilize to the first program verification voltage VPV1. Therefore, it may take a long time for the voltage of the selected word line SEL_WL to be stabilized to the first program verification voltage VPV1. To reduce the time required for the voltage of the selected word line SEL_WL to be stabilized to the first program verification voltage VPV1, a current driving capability of the negative voltage pump 512 may be required to increase. In this case, it may be necessary to increase a size of the negative voltage pump 512.

However, as described above with reference to FIGS. 1 to 8, in embodiments of the inventive concept the voltage of the selected word line SEL_WL may be stabilized from the negative bias voltage VNB to the first program verification voltage VPV1, instead of increasing to a positive voltage through the coupling effect between the selected word line SEL_WL and the unselected word lines UNSEL_WL and then being stabilized to the first program verification voltage VPV1. Therefore, the negative voltage pump 512 may have a moderate current driving capability such that the size of the negative voltage pump 512 may be reduced.

Figure 9:
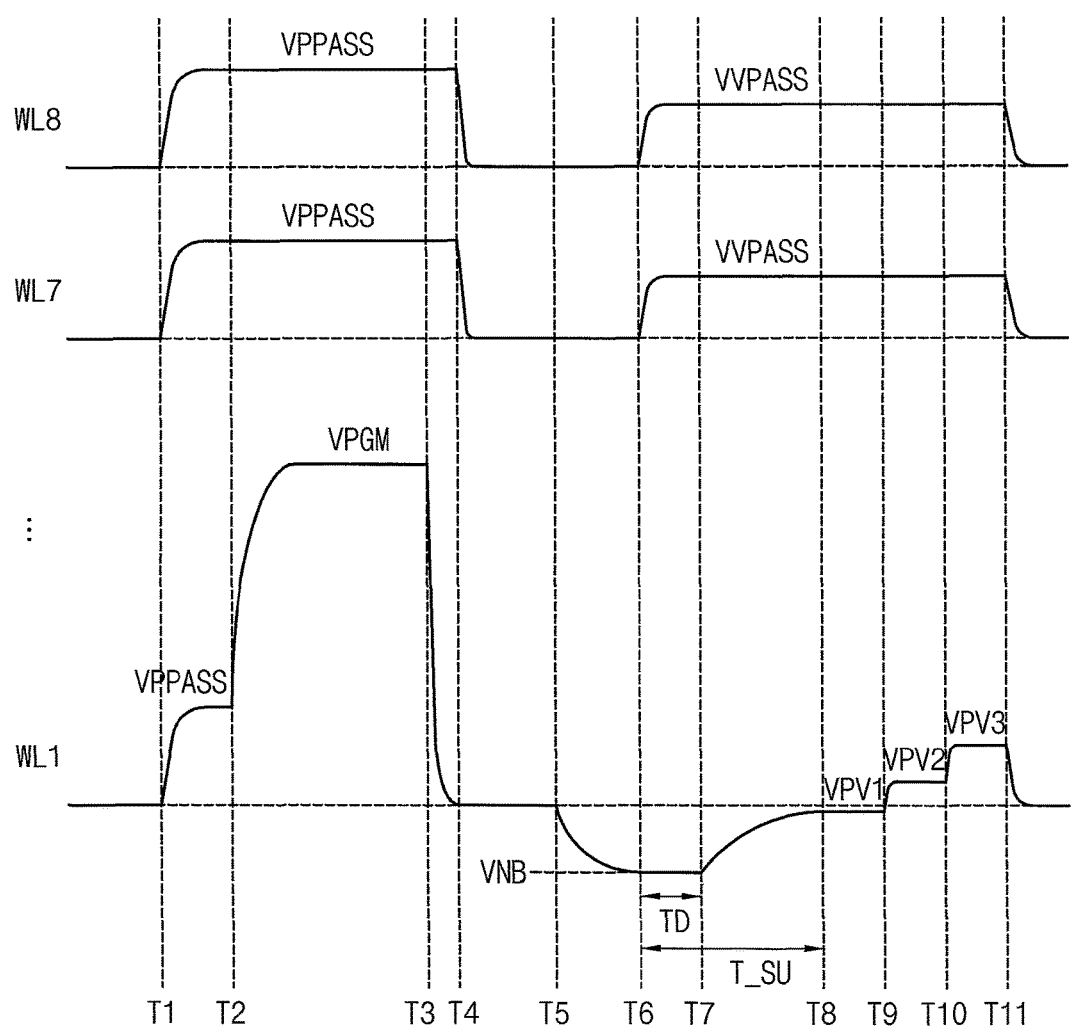
FIG. 9 illustrates a diagram descriptive of the method of programming a nonvolatile memory device of FIG. 6, according to another embodiment of the inventive concept.

FIG. 9 illustrates a diagram descriptive of the method of programming a nonvolatile memory device of FIG. 6, according to another embodiment of the inventive concept.

Operations at the first time through fifth time T1~T5 of FIG. 9 are the same as the operations at the first time through fifth time T1~T5 of FIG. 8. Description of operations at the first time through fifth time T1~T5 of FIG. 9 will therefore be omitted.

At a sixth time T6, the unselected word line voltage generator 520 applies the verification pass voltage VVPASS to the unselected word lines WL2~WL8 (step S120).

At a seventh time T7, which is after a delay time TD from the sixth time T6, the selected word line voltage generator 510 applies the first program verification voltage VPV1, which is higher than the negative bias voltage VNB and has a negative voltage level, to the selected word line WL1 (step S130).

A length of the delay time TD may be determined based on the coupling capacitance between the selected word line SEL_WL and the unselected word lines UNSEL_WL. For example, when the coupling capacitance between the selected word line SEL_WL and the unselected word lines UNSEL_WL is relatively large, the length of the delay time TD may be relatively long. On the other hand, when the coupling capacitance between the selected word line SEL_WL and the unselected word lines UNSEL_WL is relatively small, the length of the delay time TD may be relatively short.

After the voltage of the selected word line WL1 is stabilized to the first program verification voltage VPV1 at the eighth time T8, the nonvolatile memory device 10 performs the program verification operation on the selected memory cell based on the first program verification voltage VPV1.

At a ninth time T9, the selected word line voltage generator 510 applies the second program verification voltage VPV2, which has a positive voltage level, to the selected word line WL1 (step S140), and the nonvolatile memory device 10 performs the program verification operation on the selected memory cell based on the second program verification voltage VPV2.

At a tenth time T10, the selected word line voltage generator 510 may apply the third program verification voltage VPV3, which is higher than the second program verification voltage VPV2, to the selected word line WL1, and the nonvolatile memory device 10 performs the program verification operation on the selected memory cell based on the third program verification voltage VPV3.

At an eleventh time T11, the selected word line WL1 and the unselected word lines WL2~WL8 may be discharged to the ground voltage GND.

As described above with reference to FIG. 9, since the length of the delay time TD is adjusted based on the coupling capacitance between the selected word line WL1 and the unselected word lines WL2~WL8, the setup time T_SU corresponding to a time duration between the sixth time T6, at which the verification pass voltage VVPASS is applied to the unselected word lines WL2~WL8, and the eighth time T8, at which the voltage of the selected word line WL1 is stabilized to the first program verification voltage VPV1, may be further reduced.

Figure 10:
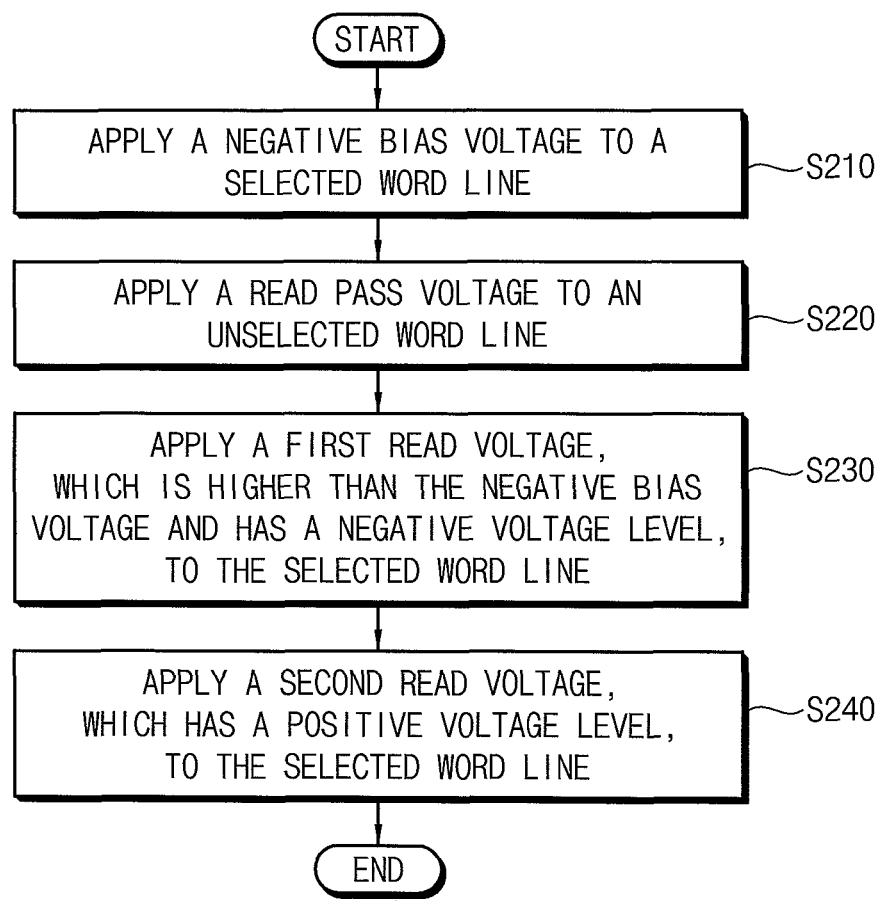
FIG. 10 illustrates a flow chart of a method of reading a nonvolatile memory device, according to an embodiment of the inventive concept.

FIG. 10 illustrates a flow chart of a method of reading a nonvolatile memory device, according to an embodiment of the inventive concept. The method of reading a nonvolatile memory device of FIG. 10 may be performed by the nonvolatile memory device 10 of FIG. 1.

After the program operation is performed on the memory cells included in the nonvolatile memory device 10, the read operation may be performed on the memory cells based on the threshold voltage of the memory cells.

Figure 11:
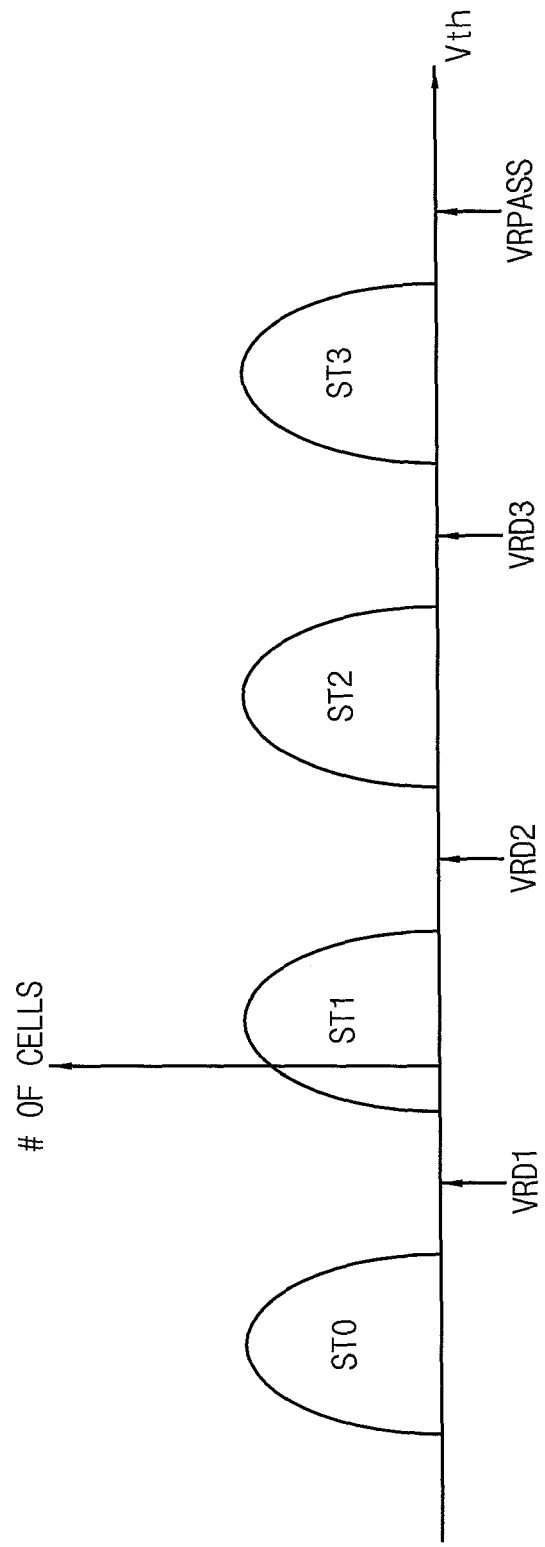
FIG. 11 illustrates a diagram of a threshold voltage distribution of memory cells included in the nonvolatile memory device of FIG. 1, according to an embodiment of the inventive concept.

FIG. 11 illustrates a diagram of a threshold voltage distribution of memory cells of the nonvolatile memory device of FIG. 1.

In FIG. 11, the x-axis represents a threshold voltage Vth of the memory cells, and the y-axis represents a number of memory cells. FIG. 11 shows that each of the memory cells has one of an erase state ST0, a first program state ST1, a second program state ST2, and a third program state ST3. However, embodiments of the inventive concept are not limited thereto, and a number of the program states may be varied.

As illustrated in FIG. 11, in the read operation, the program states ST0~ST3 of each of the memory cells may be determined based on a first read voltage VRD1, a second read voltage VRD2, and a third read voltage VRD3.

In some embodiments of the inventive concept, as illustrated in FIG. 11, the first read voltage VRD1 is a negative voltage, which is lower than the ground voltage GND, and the second read voltage VRD2 and the third read voltage VRD3 are respective positive voltages which are higher than the ground voltage GND.

During a read verification operation, the read pass voltage VRPASS, which has a sufficiently high voltage level, is applied to the unselected word lines UNSEL_WL such that memory cells coupled to the unselected word lines UNSEL_WL are turned on regardless of the program states ST0~ST3.

Figure 12:
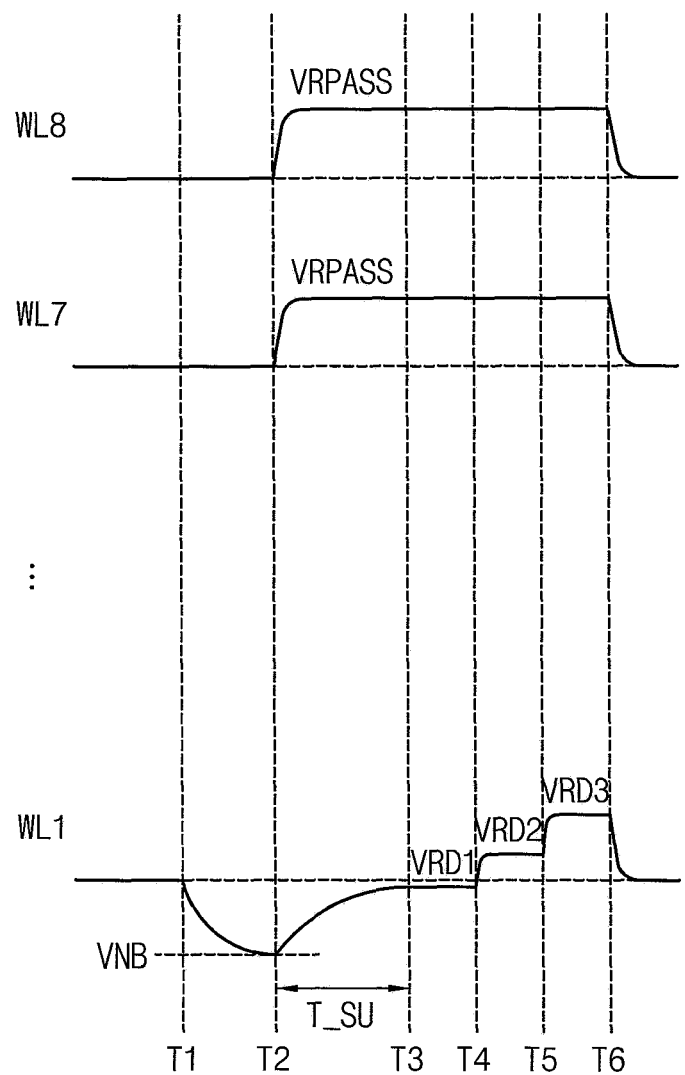
FIG. 12 illustrates a diagram descriptive of the method of reading a nonvolatile memory device of FIG. 10, according to an embodiment of the inventive concept.

FIG. 12 illustrates a diagram descriptive of the method of reading a nonvolatile memory device of FIG. 10, according to an embodiment of the inventive concept.

In FIG. 12, for purposes of explanation and not to be construed as limiting, the first word line WL1 corresponds to the selected word line SEL_WL, and the second through eighth word lines WL2~WL8 correspond to the unselected word lines UNSEL_WL.

Hereinafter, the method of reading a nonvolatile memory device of FIG. 10 will be described with reference to FIGS. 1 to 5 and 10 to 12.

When the nonvolatile memory device 10 receives a read command from an external device (e.g., a memory controller), the selected word line voltage generator 510 applies the negative bias voltage VNB to the selected word line WL1 at a first time T1 (step S210).

For example, the selected word line voltage generator 510 applies the negative bias voltage VNB to the selected word line WL1 using the negative voltage pump 512. Therefore, a voltage of the selected word line WL1 decreases to the negative bias voltage VNB.

At a second time T2, the unselected word line voltage generator 520 applies the read pass voltage VRPASS to the unselected word lines WL2~WL8 (step S220), and the selected word line voltage generator 510 applies the first read voltage VRD1, which is higher than the negative bias voltage VNB and has a negative voltage level, to the selected word line WL1 (step S230) at the same time.

A coupling capacitance may exist among the plurality of word lines WLs of the nonvolatile memory device 10. Therefore, when the read pass voltage VRPASS having a high voltage level is applied to the unselected word lines WL2~WL8 at the second time T2, the voltage of the selected word line WL1 may rapidly increase from the negative bias voltage VNB to the first read voltage VRD1 through a coupling effect. Therefore, a setup time T_SU corresponding to a time duration between the second time T2, at which the read pass voltage VRPASS is applied to the unselected word lines WL2~WL8, and a third time T3, at which the voltage of the selected word line WL1 is stabilized to the first read voltage VRD1, may be reduced.

In some embodiments of the inventive concept, a magnitude of the negative bias voltage VNB may be determined based on the coupling capacitance between the selected word line SEL_WL and the unselected word lines UNSEL_WL. For example, when the coupling capacitance between the selected word line SEL_WL and the unselected word lines UNSEL_WL is relatively large, the negative voltage pump 512 included in the selected word line voltage generator 510 may increase the magnitude of the negative drive voltage VND such that the magnitude of the negative bias voltage VNB, which is applied to the selected word line SEL_WL, may increase. On the other hand, when the coupling capacitance between the selected word line SEL_WL and the unselected word lines UNSEL_WL is relatively small, the negative voltage pump 512 included in the selected word line voltage generator 510 may decrease the magnitude of the negative drive voltage VND such that the magnitude of the negative bias voltage VNB, which is applied to the selected word line SEL_WL, may decrease.

After the voltage of the selected word line WL1 is stabilized to the first read voltage VRD1 at the third time T3, the nonvolatile memory device 10 determines whether the selected memory cell coupled to the selected word line WL1 is turned on.

At a fourth time T4, the selected word line voltage generator 510 applies the second read voltage VRD2, which has a positive voltage level, to the selected word line WL1 (step S240), and the nonvolatile memory device 10 determines whether the selected memory cell coupled to the selected word line WL1 is turned on.

At a fifth time T5, the selected word line voltage generator 510 applies the third read voltage VRD3, which is higher than the second read voltage VRD2, to the selected word line WL1, and the nonvolatile memory device 10 determines whether the selected memory cell coupled to the selected word line WL1 is turned on.

At a sixth time T6, the selected word line WL1 and the unselected word lines WL2~WL8 are discharged to the ground voltage GND.

In response to the read command, if the read pass voltage VRPASS is applied to the unselected word lines UNSEL_WL and the first read voltage VRD1 is applied to the selected word line SEL_WL while the voltage of the selected word line SEL_WL is the ground voltage GND, the voltage of the selected word line SEL_WL may increase to a positive voltage through a coupling effect between the selected word line SEL_WL and the unselected word lines UNSEL_WL and then stabilize to the first read voltage VRD1. Therefore, it may take a long time for the voltage of the selected word line SEL_WL to be stabilized to the first read voltage VRD1.

However, as described above with reference to FIGS. 1 to 5 and 10 to 12, in the method of reading a nonvolatile memory device according to embodiments of the inventive concept, after the negative bias voltage VNB is applied to the selected word line SEL_WL, the read pass voltage VRPASS is applied to the unselected word lines UNSEL_WL and the first read voltage VRD1 is applied to the selected word line SEL_WL to perform the read operation. Therefore, when the read pass voltage VRPASS is applied to the unselected word lines UNSEL_WL, the voltage of the selected word line SEL_WL may rapidly increase from the negative bias voltage VNB to the first read voltage VRD1 through the coupling effect. Therefore, the setup time T_SU corresponding to a time duration between a time, at which the read pass voltage VRPASS is applied to the unselected word lines UNSEL_WL, and a time, at which the voltage of the selected word line SEL_WL is stabilized to the first read voltage VRD1, may be reduced. As such, a read speed of the nonvolatile memory device 10 may effectively increase.

In addition, in response to the read command, if the read pass voltage VRPASS is applied to the unselected word lines UNSEL_WL and the first read voltage VRD1 is applied to the selected word line SEL_WL while the voltage of the selected word line SEL_WL is the ground voltage GND, the voltage of the selected word line SEL_WL may increase to a positive voltage through a coupling effect between the selected word line SEL_WL and the unselected word lines UNSEL_WL and then stabilize to the first read voltage VRD1. Therefore, it may take a long time for the voltage of the selected word line SEL_WL to be stabilized to the first read voltage VRD1. To reduce the time required for the voltage of the selected word line SEL_WL to be stabilized to the first read voltage VRD1, a current driving capability of the negative voltage pump 512 may be required to increase. In this case, it may be necessary to increase a size of the negative voltage pump 512.

However, as described above with reference to FIGS. 1 to 5 and 10 to 12, in embodiments of the inventive concept the voltage of the selected word line SEL_WL may be stabilized from the negative bias voltage VNB to the first read voltage VRD1, instead of increasing to a positive voltage through the coupling effect between the selected word line SEL_WL and the unselected word lines UNSEL_WL and then being stabilized to the first read voltage VRD1. Therefore, the negative voltage pump 512 may have a moderate current driving capability such that the size of the negative voltage pump 512 may be reduced.

Figure 13:
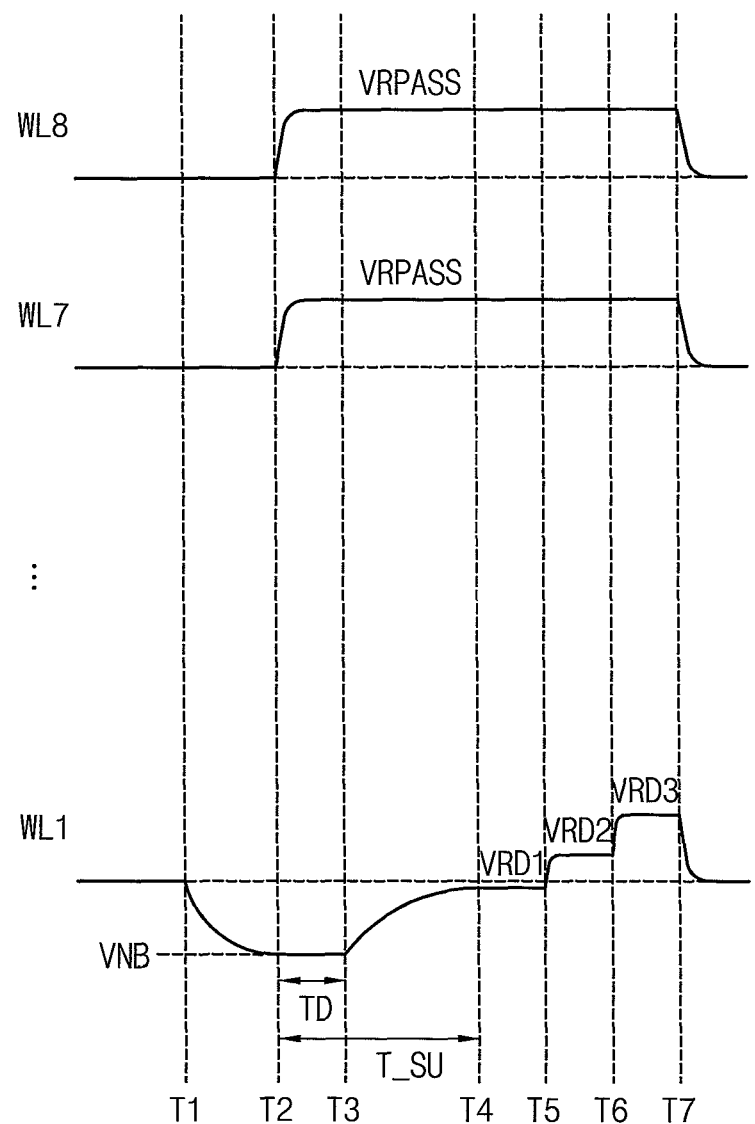
FIG. 13 illustrates a diagram descriptive of the method of reading a nonvolatile memory device of FIG. 10, according to another embodiment of the inventive concept.

FIG. 13 illustrates a diagram descriptive of the method of reading a nonvolatile memory device of FIG. 10, according to an embodiment of the inventive concept.

When the nonvolatile memory device 10 receives a read command from an external device (e.g., a memory controller), the selected word line voltage generator 510 applies the negative bias voltage VNB to the selected word line WL1 at a first time T1 (step S210).

At a second time T2, the unselected word line voltage generator 520 applies the read pass voltage VRPASS to the unselected word lines WL2~WL8 (step S220).

At a third time T3, which is after a delay time TD from the second time T2, the selected word line voltage generator 510 applies the first read voltage VRD1, which is higher than the negative bias voltage VNB and has a negative voltage level, to the selected word line WL1 (step S230).

A length of the delay time TD may be determined based on the coupling capacitance between the selected word line SEL_WL and the unselected word lines UNSEL_WL. For example, when the coupling capacitance between the selected word line SEL_WL and the unselected word lines UNSEL_WL is relatively large, the length of the delay time TD may be relatively long. On the other hand, when the coupling capacitance between the selected word line SEL_WL and the unselected word lines UNSEL_WL is relatively small, the length of the delay time TD may be relatively short.

After the voltage of the selected word line WL1 is stabilized to the first read voltage VRD1 at a fourth time T4, the nonvolatile memory device 10 determines whether the selected memory cell coupled to the selected word line WL1 is turned on.

At a fifth time T5, the selected word line voltage generator 510 applies the second read voltage VRD2, which has a positive voltage level, to the selected word line WL1 (step S240), and the nonvolatile memory device 10 determines whether the selected memory cell coupled to the selected word line WL1 is turned on.

At a sixth time T6, the selected word line voltage generator 510 applies the third read voltage VRD3, which is higher than the second read voltage VRD2, to the selected word line WL1, and the nonvolatile memory device 10 determines whether the selected memory cell coupled to the selected word line WL1 is turned on.

At a seventh time T7, the selected word line WL1 and the unselected word lines WL2~WL8 are discharged to the ground voltage GND.

As described above with reference to FIG. 13, since the length of the delay time TD is adjusted based on the coupling capacitance between the selected word line WL1 and the unselected word lines WL2~WL8, the setup time T_SU corresponding to a time duration between the second time T2 at which the read pass voltage VRPASS is applied to the unselected word lines WL2~WL8, and the fourth time T4 at which the voltage of the selected word line WL1 is stabilized to the first read voltage VRD1, may be further reduced.

Figure 14:
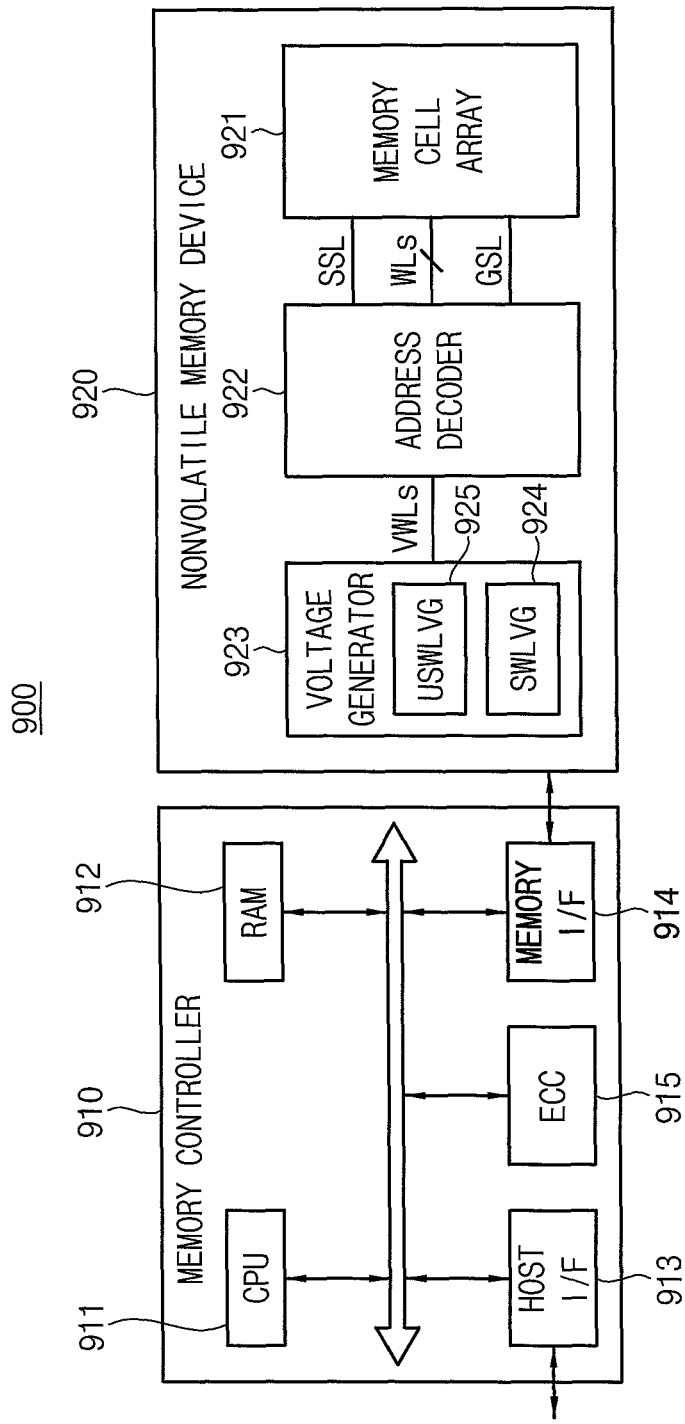
FIG. 14 illustrates a block diagram of a memory system, according to an embodiment of the inventive concept.

FIG. 14 illustrates a block diagram of a memory system, according to an embodiment of the inventive concept.

Referring to FIG. 14, a memory system 900 includes a memory controller 910 and a nonvolatile memory device 920.

The nonvolatile memory device 920 includes a memory cell array 921, an address decoder 922, and a voltage generator 923. The memory cell array 921 may include a plurality of memory cell strings. The plurality of memory cell strings may be coupled to the address decoder 922 through a string selection line SSL, a plurality of word lines WLs, and a ground selection line GSL.

During a program operation or a read operation, the address decoder 922 determines one of the plurality of word lines WLs as a selected word line SEL_WL and determines the rest of the plurality of word lines WLs except for the selected word line SEL_WL as unselected word lines UNSEL_WL.

The voltage generator 923 generates word line voltages VWLs, which are required for the operation of the nonvolatile memory device 920. The word line voltages VWLs are applied to the plurality of word lines WLs through the address decoder 922.

The voltage generator 923 includes a selected word line voltage generator SWLVG 924 and an unselected word line voltage generator USWLVG 925.

During the program operation or the read operation, the address decoder 922 couples the selected word line SEL_WL to the selected word line voltage generator 924, and couples the unselected word lines UNSEL_WL to the unselected word line voltage generator 925. During the program operation or the read operation, the selected word line voltage generator 924 generates a voltage that is to be applied to the selected word line SEL_WL, and the unselected word line voltage generator 925 generates a voltage that is to be applied to the unselected word lines UNSEL_WL.

The nonvolatile memory device 920 may be implemented with the nonvolatile memory device 10 of FIG. 1. A structure and an operation of the nonvolatile memory device 10 of FIG. 1 are described above with reference to FIGS. 1 to 13. Therefore, detailed description of the nonvolatile memory device 920 will be omitted here.

The memory controller 910 controls the nonvolatile memory device 920. The memory controller 910 controls data transfer between an external host and the nonvolatile memory device 920.

The memory controller 910 includes a central processing unit CPU 911, a buffer memory RAM 912, a host interface 913 and a memory interface 914.

The central processing unit 911 performs operations for the data transfer. The buffer memory 912 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), or the like.

The buffer memory 912 may be an operational memory of the central processing unit 911. In embodiments of the inventive concept, the buffer memory 912 may be included in the memory controller 910. In other embodiments of the inventive concept, the buffer memory 912 may be outside of the memory controller 910.

The host interface 913 may be coupled to the host, and the memory interface 914 may be coupled to the nonvolatile memory device 920. The central processing unit 911 communicates with the host via the host interface 913. For example, the host interface 913 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), or the like. Further, the central processing unit 911 communicates with the nonvolatile memory device 920 via the memory interface 914.

In some embodiments of the inventive concept, the memory controller 910 may further include an error correction block ECC 915 for error correction.

In some embodiments of the inventive concept, the memory controller 910 may be built in the nonvolatile memory device 920, or the memory controller 910 and the nonvolatile memory device 920 may be implemented as separate chips.

The memory system 900 may be implemented as a memory card, a solid state drive, or the like.

Figure 15:
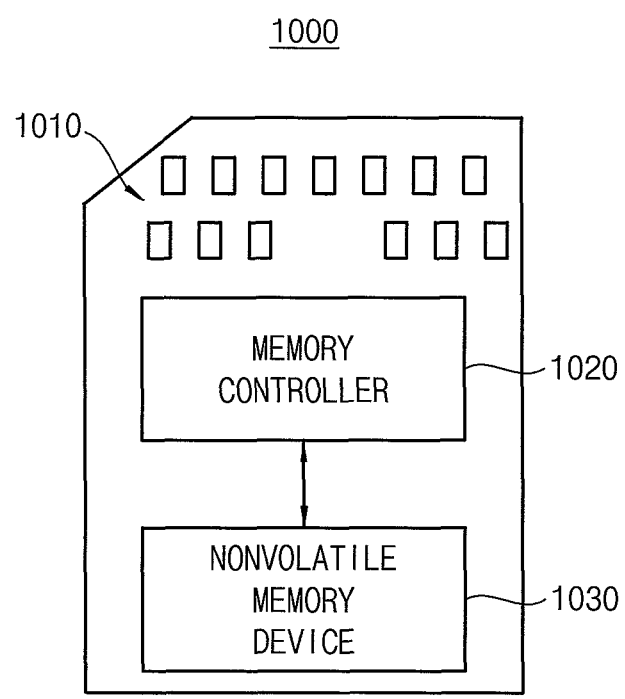
FIG. 15 illustrates a block diagram of a memory card, according to an embodiment of the inventive concept.

FIG. 15 illustrates a block diagram of a memory card, according to an embodiment of the inventive concept.

Referring to FIG. 15, a memory card 1000 includes a plurality of connecting pins 1010, a memory controller 1020 and a nonvolatile memory device 1030.

The connecting pins 1010 may be coupled to an external host to transfer signals between the host and the memory card 1000. The connecting pins 1010 may include a clock pin, a command pin, a data pin and/or a reset pin.

The memory controller 1020 receives data from the host, and stores the received data in the nonvolatile memory device 1030.

The nonvolatile memory device 1030 may be implemented with the nonvolatile memory device 10 of FIG. 1. A structure and an operation of the nonvolatile memory device 10 of FIG. 1 are described above with reference to FIGS. 1 to 13. Therefore, detailed description of the nonvolatile memory device 1030 will be omitted here.

The memory card 1000 may include an MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, or the like.

In some embodiments of the inventive concept, the memory card 1000 may be coupled to the host, such as a desktop computer, a laptop computer, a tablet computer, a mobile phone, a smart phone, a music player, a personal digital assistant (PDA), a portable multimedia player (PMP), a digital television, a digital camera, a portable game console, or the like.

Figure 16:
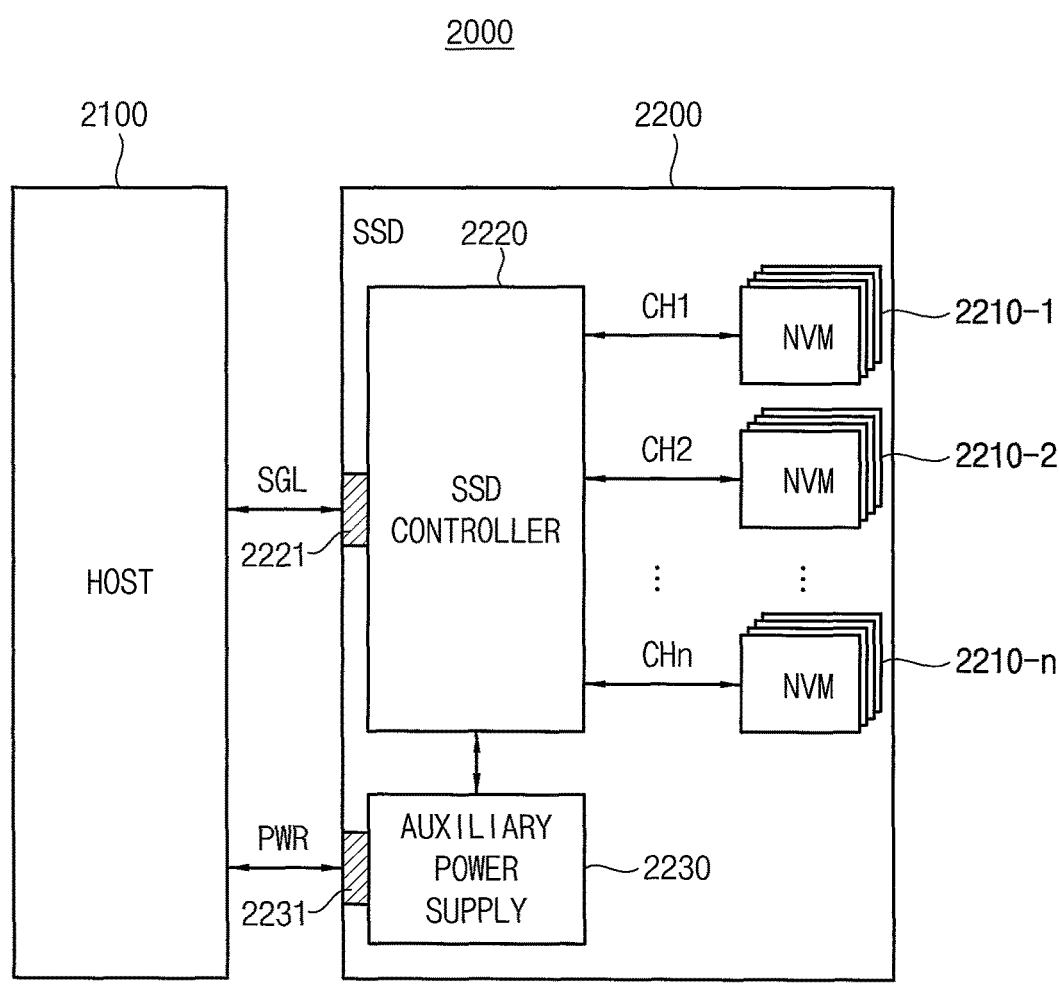
FIG. 16 illustrates a block diagram of a solid state drive (SSD) system, according to an embodiment of the inventive concept.

FIG. 16 illustrates a block diagram of a solid state drive (SSD) system, according to an embodiment of the inventive concept.

Referring to FIG. 16, an SSD system 2000 includes a host 2100 and a SSD 2200.

The SSD 2200 includes first through n-th nonvolatile memory devices 2210-1, 2210-2, ..., 2210-n and a SSD controller 2220.

The first through n-th nonvolatile memory devices 2210-1, 2210-2, ..., 2210-n may be used as a storage medium of the SSD 2200. Each of the first through n-th nonvolatile memory devices 2210-1, 2210-2, ..., 2210-n may be implemented with the nonvolatile memory device 10 of FIG. 1. A structure and an operation of the nonvolatile memory device 10 of FIG. 1 are described above with reference to FIGS. 1 to 13. Therefore, detailed description of the first through n-th nonvolatile memory devices 2210-1, 2210-2, ..., 2210-n will be omitted here.

The SSD controller 2220 is coupled to the first through n-th nonvolatile memory devices 2210-1, 2210-2, ..., 2210-n by first through n-th channels CH1, CH2, ..., CHn, respectively.

The SSD controller 2220 may exchange a signal SGL with the host 2100 through a signal connector 2221. The signal SGL may include a command, an address and data. The SSD controller 2220 performs a program operation and a read operation on the first through n-th nonvolatile memory devices 2210-1, 2210-2, ..., 2210-n according to the command received from the host 2100.

The SSD 2200 may further include an auxiliary power supply 2230. The auxiliary power supply 2230 may receive power PWR from the host 2100 through a power connector 2231 and provide power to the SSD controller 2220. The auxiliary power supply 2230 may be placed inside or outside the SSD 2200. For example, the auxiliary power supply 2230 may be placed in a main board and provide auxiliary power to the SSD 2200.

Figure 17:
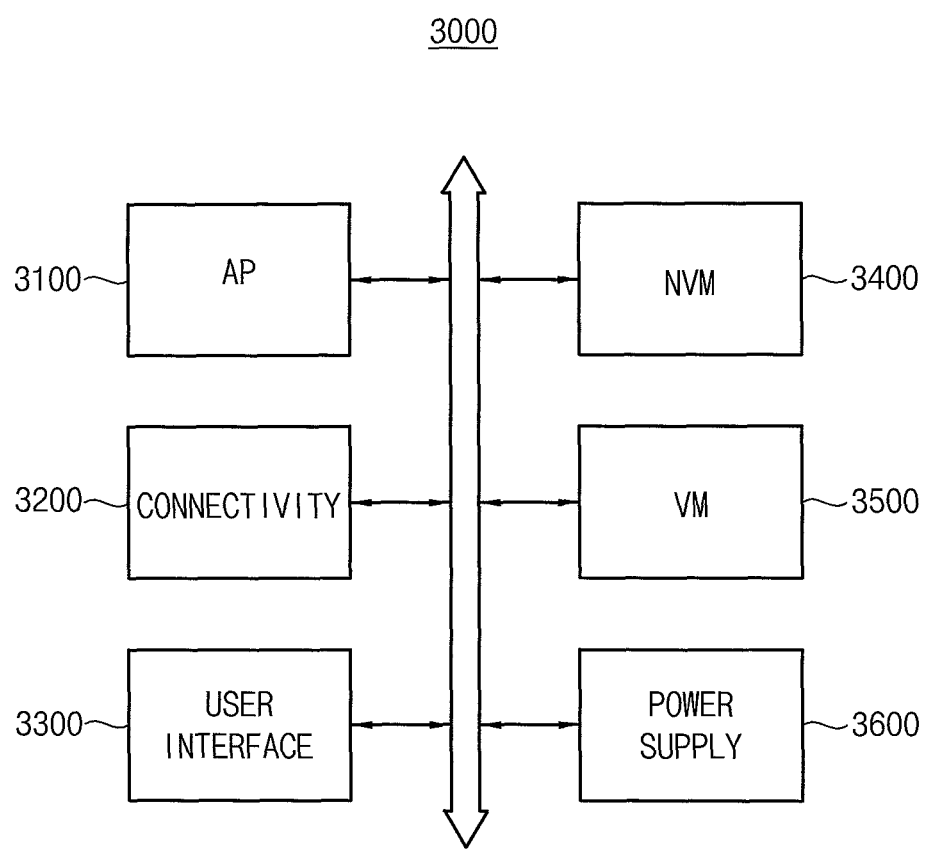
FIG. 17 illustrates a block diagram of a mobile system, according to an embodiment of the inventive concept.

FIG. 17 illustrates a block diagram of a mobile system, according to an embodiment of the inventive concept.

Referring to FIG. 17, a mobile system 3000 includes an application processor AP 3100, a connectivity circuit 3200, a user interface 3300, a nonvolatile memory device NVM 3400, a volatile memory device VM 3500 and a power supply 3600.

In embodiments of the inventive concept, the mobile system 3000 may be a mobile phone, a smart phone, a personal digital assistant (PDA), a portable multimedia player (PMP), a digital camera, a music player, a portable game console, a navigation system, or the like.

The application processor 3100 may execute applications, such as a web browser, a game application, a video player, or the like. In embodiments of the inventive concept, the application processor 3100 may include a single core or multiple cores. For example, the application processor 3100 may be a multi-core processor, such as a dual-core processor, a quad-core processor, a hexa-core processor, or other multi-core processors. The application processor 3100 may include an internal or external cache memory.

The connectivity circuit 3200 may perform wired or wireless communication with an external device. For example, the connectivity circuit 3200 may perform Ethernet communication, near field communication (NFC), radio frequency identification (RFID) communication, mobile telecommunication, memory card communication, universal serial bus (USB) communication, or the like. In embodiments of the inventive concept, the connectivity circuit 3200 may include a baseband chipset that supports communications, such as global system for mobile communications (GSM), general packet radio service (GPRS), wideband code division multiple access (WCDMA), high speed downlink/uplink packet access (HSxPA), or other communication.

The nonvolatile memory device 3400 may store a boot image for booting the mobile system 3000.

The nonvolatile memory device 3400 may be implemented with the nonvolatile memory device 10 of FIG. 1. A structure and an operation of the nonvolatile memory device 10 of FIG. 1 are described above with reference to FIGS. 1 to 13. Therefore, detailed description of the nonvolatile memory device 3400 will be omitted here.

The volatile memory device 3500 may store data processed by the application processor 3100, or may operate as a working memory.

The user interface 3300 may include at least one input device, such as a keypad, a touch screen, or the like, and at least one output device, such as a speaker, a display device, or the like.

The power supply 3600 may supply a power supply voltage to the mobile system 3000.

In embodiments of the inventive concept, the mobile system 3000 may further include an image processor, and/or a storage device, such as a memory card, a solid state drive (SSD), a hard disk drive (HDD), a CD-ROM, or other components.

In embodiments of the inventive concept, the mobile system 3000 and/or components of the mobile system 3000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The foregoing is illustrative of the inventive concept and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming a nonvolatile memory device, the method comprising:
    performing a program operation on a selected memory cell coupled to a selected word line in response to a program command;
    applying a negative bias voltage to the selected word line;
    applying a verification pass voltage to an unselected word line after the negative bias voltage is applied to the selected word line;
    applying a first program verification voltage, which is higher than the negative bias voltage and lower than a ground voltage, to the selected word line; and
    applying a second program verification voltage, which has a positive voltage level, to the selected word line after the first program verification voltage is applied to the selected word line.

2. The method of claim 1, wherein the first program verification voltage is applied to the selected word line at a same time as the verification pass voltage is applied to the unselected word line.

3. The method of claim 1, wherein the first program verification voltage is applied to the selected word line after a delay time from a time at which the verification pass voltage is applied to the unselected word line.

4. The method of claim 3, wherein the delay time is adjusted based on a coupling capacitance between the selected word line and the unselected word line.

5. The method of claim 1, wherein a magnitude of the negative bias voltage is determined based on a coupling capacitance between the selected word line and the unselected word line.

6. The method of claim 1, wherein the negative bias voltage and the first program verification voltage are generated by a selected word line voltage generator, and
    the verification pass voltage is generated by an unselected word line voltage generator.

7. The method of claim 1, wherein the nonvolatile memory device comprises a three dimensional memory cell array.

8. A method of reading a nonvolatile memory device, the method comprising:
    applying a negative bias voltage to a selected word line in response to a read command;
    applying a read pass voltage to an unselected word line after the negative bias voltage is applied to the selected word line;
    applying a first read voltage, which is higher than the negative bias voltage and lower than a ground voltage, to the selected word line; and
    applying a second read voltage, which has a positive voltage level, to the selected word line after the first read voltage is applied to the selected word line.

9. The method of claim 8, wherein the first read voltage is applied to the selected word line at a same time as the read pass voltage is applied to the unselected word line.

10. The method of claim 8, wherein the first read voltage is applied to the selected word line after a delay time from a time at which the read pass voltage is applied to the unselected word line.

11. The method of claim 10, wherein the delay time is adjusted based on a coupling capacitance between the selected word line and the unselected word line.

12. The method of claim 8, wherein a magnitude of the negative bias voltage is determined based on a coupling capacitance between the selected word line and the unselected word line.

13. The method of claim 8, wherein the negative bias voltage and the first read voltage are generated by a selected word line voltage generator, and
    the read pass voltage is generated by an unselected word line voltage generator.

14. A method of performing a memory access operation to a nonvolatile memory device, the method comprising:
    applying a negative bias voltage to a selected word line in response to a command;
    applying an operation pass voltage to an unselected word line after the negative bias voltage is applied to the selected word line;
    applying a first operation voltage, which is higher than the negative bias voltage and lower than a ground voltage, to the selected word line; and wherein the first operation voltage is applied to the selected word line after a delay time from a time at which the operation pass voltage is applied to the unselected word line.

15. The method of claim 14, wherein the memory access operation comprises a program operation, the negative bias voltage is applied after the program operation, the operation pass voltage comprises a verification pass voltage, and the first operation voltage comprises a first program verification voltage.

16. The method of claim 14, wherein the memory access operation comprises a read operation, the operation pass voltage comprises a read pass voltage, and the first operation voltage comprises a first read voltage.

* * * * *